United States Patent
Park

[11] Patent Number: 5,929,484
[45] Date of Patent: Jul. 27, 1999

[54] HIGH VOLTAGE SEMICONDUCTOR DEVICE

[75] Inventor: Sang-Jun Park, Kyoungki-do, Rep. of Korea

[73] Assignee: Hyundai Electronics Industries Co., Ltd., Kyoungki-do, Rep. of Korea

[21] Appl. No.: 08/883,918

[22] Filed: Jun. 27, 1997

[30] Foreign Application Priority Data

Jun. 29, 1996 [KR] Rep. of Korea ..................... 96-26314

[51] Int. Cl.[6] .......................... H01L 29/74; H01L 29/76; H01L 31/062
[52] U.S. Cl. .......................... 257/341; 257/342; 257/139
[58] Field of Search .................................. 257/141, 162, 257/335, 337, 341, 343, 500, 502, 139, 138

[56] References Cited

U.S. PATENT DOCUMENTS

| | | | |
|---|---|---|---|
| 4,823,173 | 4/1989 | Beasom | 357/22 |
| 5,352,914 | 10/1994 | Farb | 257/339 |
| 5,357,135 | 10/1994 | Aronowitz et al. | 257/339 |

FOREIGN PATENT DOCUMENTS 52-23277  2/1997  Japan .................................... 257/343

*Primary Examiner*—Wael M. Fahmy
*Attorney, Agent, or Firm*—Ware, Fressola, Van Der Sluys & Adolphson LLP

[57] ABSTRACT

The present invention discloses a high voltage semiconductor device with high breakdown voltage without increment in area occupied an increase in the size of junction region. Each junction region includes: (i) a first impurity region of a first conductivity type of a low impurity concentration formed at a predetermined position in the semiconductor substrate, (ii) a second impurity region of a second conductivity type of a medium impurity concentration formed in the first impurity region, a part of the second impurity region being exposed to the surface of the substrate, and (iii) a third impurity region of a first conductivity type of a high impurity concentration, the third impurity region being in contact with the second impurity region, wherein a reverse bias is applied to the third impurity region.

4 Claims, 3 Drawing Sheets

HIGH VOLTAGE SEMICONDUCTOR DEVICE

BACKGROUND OF THE INVENTION

1. Field of the Invention

The present invention generally relates to a high voltage semiconductor device, and more particularly to a high voltage semiconductor device having a high breakdown voltage and a fabrication method thereof.

2. Description of the Related Art

Generally, a high voltage transistor has a property of driving a signal processing part which processes an electrical signal and a mechanical part which operates according to a processing result of the electrical signal, the property being different from most semiconductor devices. In order to effectively drive the mechanical part, high power(current x voltage) should be provided. In most cases, a large current is provided in the application of high power. There exist, however, many cases needing a high voltage difference. In such cases, when the driving voltage approaches 100 V, a high breakdown voltage should be ensured in order to protect the high voltage semiconductor device. A conventional high voltage semiconductor device essentially requires an optimized drain structure. In a conventional case, a potential absorption method using a doping profile is used. In further detail, resistance difference due to a concentration difference between $n^+/n^-$ doped regions, and dispersion of electric field are used. As a result, the area of drain region increases with the increase in the driving voltage. Therefore, when current above a certain level, is abruptly introduced to a drain region having a resistance which allows only a current below the certain level to flow. As a result, there is an increased probability of breakdown due to joule heat, of snapback breakdown due to hot carriers.

SUMMARY OF THE INVENTION

Accordingly, it is an object of the present invention to provide a high voltage semiconductor device capable of sufficiently buffering a potential by using a reverse biases p-n junction, and to provide a fabrication method of the above semiconductor device.

According to the present invention, a high voltage semiconductor device comprises: (a) two junction regions separately formed from each other in a semiconductor substrate; and (b) a terminal for controlling carrier flow between the two junction regions, wherein each junction region comprises (i) a first impurity region of a first conductivity type of a low impurity concentration formed at a predetermined position in the semiconductor substrate, (ii) a second impurity region of a second conductivity type of a medium impurity concentration formed in the first impurity region, a part of the second impurity region being exposed to the surface of the substrate, and (iii) a third impurity region of a first conductivity type of a high impurity concentration, the third impurity region being in contact with the second impurity region, wherein a reverse bias is applied to the third impurity region.

According to the present invention, a method of fabricating for high voltage semiconductor device, comprising the steps of: forming a first impurity regions of a second conductivity type of a low impurity concentration in a predetermined source and drain region formed in a semiconductor substrate, in which a well of a first conductivity type is formed; forming isolation layers on a predetermined portion of the semiconductor substrate; forming a stacked pattern in on order of gate oxide and gate electrode on the substrate between the first impurity regions; forming a side wall spacer on the both side wall of the gate electrode; forming second impurity regions of the first conductivity type of a medium impurity concentration at a predetermined depth in a predetermined portion of the first impurity region adjacent to the drain; forming interlayer dielectric film at a predetermined thickness on the whole surface of the substrate; forming contact holes whereby the contact holes simultaneously exposes predetermined portions of the first and second impurity regions; forming a third impurity regions of the second conductivity type of a high impurity concentration in the exposed portions; forming interconnection lines electrically connecting with the third impurity regions by filling up the contact holes.

BRIEF DESCRIPTION OF THE ATTACHED DRAWINGS

The objects and features of the invention may be better understood with reference to the following detailed description, appended claims, and attached drawings wherein:

DETAILED DESCRIPTION OF PREFERRED EMBODIMENT

An embodiment according to the present invention is described below with reference the attached drawings.

Figure 2A:
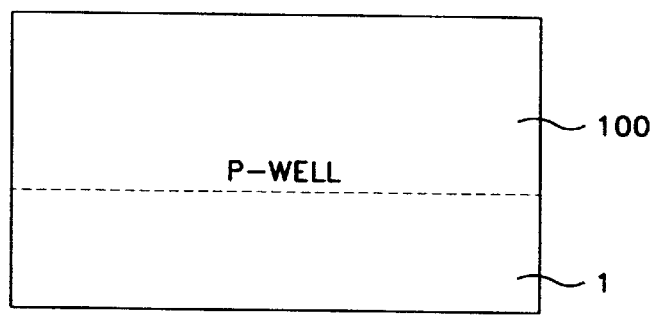
FIGS. 2A to 2G are sectional views showing a process for fabricating the high voltage semiconductor device of FIG. 1.
Figure 2B:
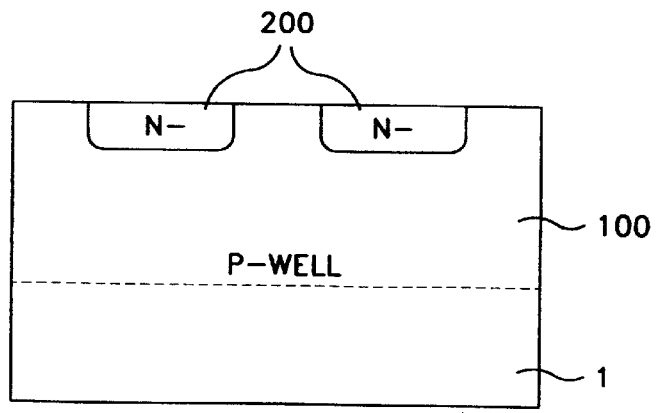

Referring to FIG. 2A, a P-well 100 is formed in a P-type semiconductor substrate 1. Afterwards, as shown in FIG. 2B, $N^-$ offset regions 200 for absorbing a potential at a drain side, are formed at selected portions in the P-well 100. Furthermore, the $N^-$ offset regions 200 should be formed at a concentration and a junction depth in relation to a selected operational voltage of the transistor. For instance, if a transistor to be formed by subsequent processes, operates at a high voltage of 40 V, the transistor should have a concentration of $\sim 10^{16}$ atoms/cm$^3$ and a junction depth of 10 $\mu$m.

Figure 2C:
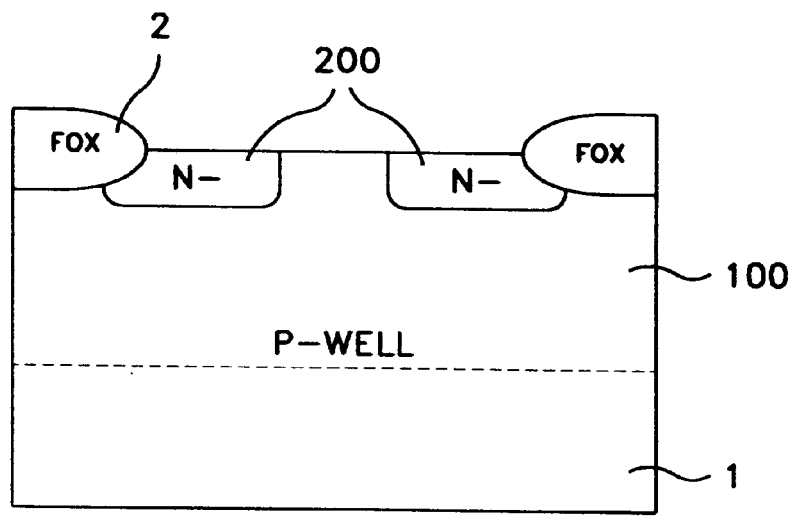
Figure 2D:
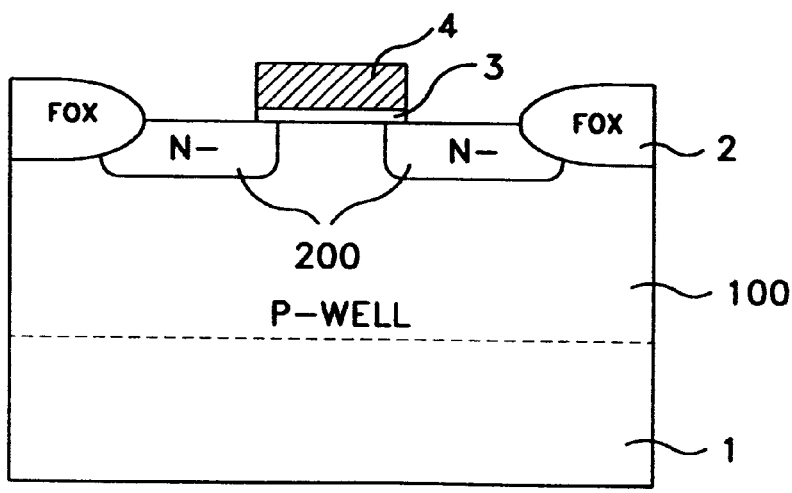

Referring to FIG. 2C, field oxides 2 are formed at selected portions of the semiconductor substrate 1. Thereafter, a gate oxide 3 is formed on the semiconductor substrate 1 and a gate 4 is then formed on the gate oxide 3 as shown in FIG. 2D.

Figure 2E:
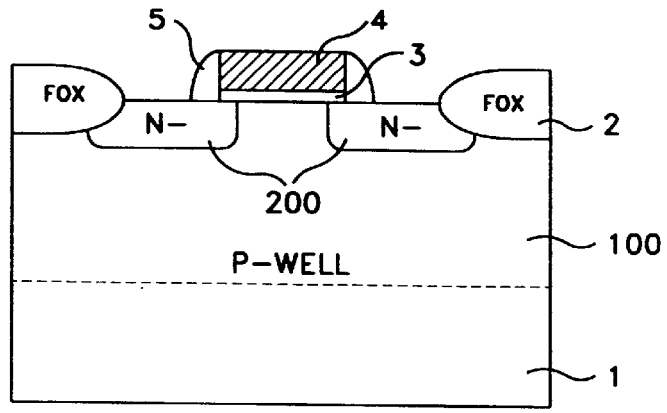

Referring to FIG. 2E, oxides which act as spacer is formed on the sidewalls of the gate 4 and the gate oxide 3. The spacer 5 is formed by a depositing an oxide film on the whole surface of the substrate including the gate 4 and the gate oxide 3, and then anisotropically etching the deposited film until the surface of the gate 4 is exposed. Length of the spacer 5 is a very important factor in the determination of breakdown voltage of the transistor to be formed.

Figure 2F:
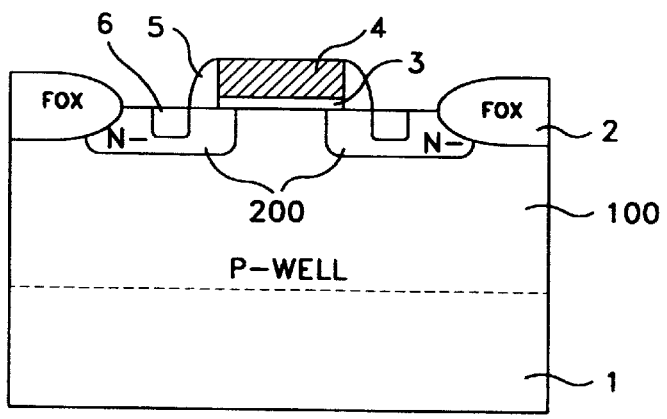

Referring to FIG. 2F, a p type buffer regions 6 at a medium impurity concentration are formed in $N^-$ offset region 200 by the conventional method. The p type buffer regions 6 are to absorb lateral drain field of the sidewall spacer 5. Concentration and depth of the p type buffer regions 6 must be properly designated to consider potential distribution between the $N^-$ offset region 200 and a $N^+$ impurity region that are to be formed in the following-up process.

Figure 2G:
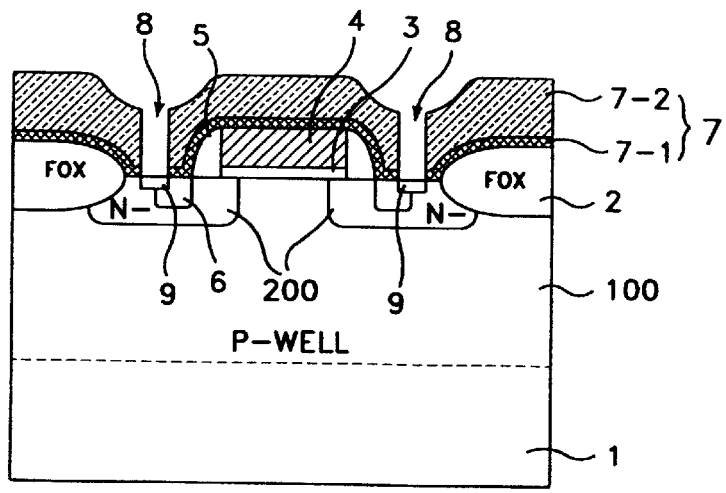

Referring to FIG. 2G, an interlayer dielectric film 7 is deposited of the whole surface of the substrate and is then increased in density. The interlayer dielectric film 7 is a stacked structure wherein a BPSG layer 7-2 is formed on a TEOS layer 7-1. Afterwards, contact holes 8 exposing a portion of the N⁻ offset region 200 and p type buffer regions 6, are formed by etching predetermined portions of the interlayer dielectric film 7. Thereafter, a N type impurity ions such as arsenic or phosphorous is implanted into the exposed portions of the substrate 1 at a high impurity concentration, to thereby form a N⁺ impurity regions 9 where the N-type impurity is highly doped. The N⁺ impurity regions 9 must be in contact with a portion of the P type buffer region 6 and portion of the N⁻ offset region 200, and contact area ratio thereof must be determined according to current driving force and breakdown voltage.

A relation between the above-mentioned variables can be obtained by a experimentation so that a process margin in forming the contact hole can be determined according the relation obtained from the experiment.

In transistor formed by the above-mentioned process, sub-threshold breakdown in the junction region of source and/or drain, has two components.

First, a vertical junction breakdown in a vertical direction can be sufficiently compensated by controlling the respective concentrations of the N⁺ impurity region 9 and N⁻ offset region 200. This result was confirmed from many experiments done in the development of a liquid crystal display device having thin film transistor.

Second, a horizontal junction breakdown in a horizontal direction occurs often since the P type buffer region 6 is electrically floated. The probability of the punch through phenomenon occurring, is very low.

Figure 1:
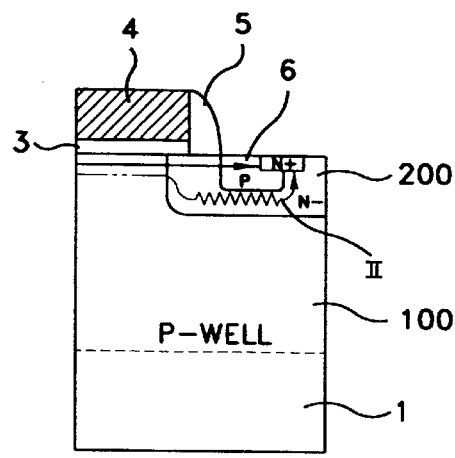
FIG. 1 is a partial sectional view of a high voltage semiconductor device according to the present invention.

When the transistor is turned on, characteristics of the transistor will be described below with reference to FIG. 1.

First, when a low voltage is applied to the N⁺ drain region, since reverse bias voltage between the N⁺ drain region and the p type buffer region is low, the P type buffer region is electrically floated. Therefore, a current flows in the N⁺ drain, N⁻ offset region, channel, and source, in that order. Accordingly, the current flows through N⁻ offset region below P type buffer region.

Second, at a high drain voltage, a current respectively flows in the N+ drain, P type buffer region, N⁻ offset region, channel an source, in that order. As a drain voltage is elevated at a high voltage of 40 V, the N⁻ offset region has high resistance, whereby IR drop occurs. Thus, a potential barrier between the P buffer region and the N- offset region near the channel, is lowered and the number of electrons running beyond the barrier increases. At this time, holes of the P type buffer region are depleted. As a result, a resistance of the P type buffer region becomes very small and is smaller than that of the N⁻ offset region so that a relative larger current flows through the P type buffer region.

As described previously, the present invention can provide a high voltage transistor having a buffer region which is electrically floated in a junction region of source and/or drain, and a highly doped impurity region which is electrically connected to an interconnect at a reverse bias. The transistor has a small area and a high breakdown voltage in a horizontal direction. Therefore, the invention increases the integration of semiconductor device and enhances breakdown characteristic.

While this invention has been described with reference to illustrative embodiment, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as falling within the true scope of the invention.

What is claimed is:

1. A high voltage semiconductor device comprising:
   (a) two junction regions separately formed from each other in a semiconductor substrate; and
   (b) a terminal for controlling carrier flow between the two junction regions, wherein each junction region comprises
      (i) a first impurity region of a first conductivity type of an impurity concentration level selected in relation to an operational voltage of a transistor and formed at a selected position in the semiconductor substrate,
      (ii) a second impurity region of a second conductivity type having a selected impurity concentration that is higher than the concentration level of the first impurity region, and formed in the first impurity region, a part of the second impurity region being exposed to a surface of the substrate, and
      (iii) a third impurity region of the first conductivity type having an impurity concentration level higher than that of the second impurity region, the third impurity region being in contact with a portion of the second impurity region and a portion of the first impurity region, wherein a reverse bias is applied to the third impurity region.

2. The high voltage semiconductor device as claimed in claim 1, wherein the first conductivity type is a P type impurity.

3. The high voltage semiconductor device as claimed in claim 1, wherein the first conductivity type is a N type impurity.

4. The high voltage semiconductor device as claimed in claim 1, wherein the second impurity region is electrically floated when a low voltage is applied to the third impurity region.

* * * * *

UNITED STATES PATENT AND TRADEMARK OFFICE
CERTIFICATE OF CORRECTION

PATENT NO. : 5,929,484
DATED : July 27, 1999
INVENTOR(S) : S. Park

It is certified that error appears in the above-identified patent and that said Letters Patent is hereby corrected as shown below:

At column 3, line 47, please cancel "N-" and substitute --N⁻-- therefor.

Signed and Sealed this

Twenty-second Day of August, 2000

Attest:

Q. TODD DICKINSON

Attesting Officer

Director of Patents and Trademarks